US011133288B2

(12) United States Patent
Kim

(10) Patent No.: US 11,133,288 B2
(45) Date of Patent: Sep. 28, 2021

(54) SEMICONDUCTOR PACKAGE INCLUDING STACKED SEMICONDUCTOR CHIPS

(71) Applicant: SK hynix Inc., Icheon-si (KR)

(72) Inventor: Jae-Min Kim, Icheon-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 15/930,130

(22) Filed: May 12, 2020

(65) Prior Publication Data
US 2021/0091040 A1 Mar. 25, 2021

(30) Foreign Application Priority Data
Sep. 25, 2019 (KR) .................. 10-2019-0118014

(51) Int. Cl.
H01L 25/065 (2006.01)
H01L 25/07 (2006.01)
(Continued)

(52) U.S. Cl.
CPC ...... H01L 25/0657 (2013.01); H01L 23/3128 (2013.01); H01L 23/49816 (2013.01); H01L 23/49822 (2013.01); H01L 25/0652 (2013.01); H01L 25/074 (2013.01); H01L 25/0756 (2013.01); H01L 2225/0651 (2013.01); H01L 2225/06562 (2013.01)

(58) Field of Classification Search
CPC ............ H01L 25/0657; H01L 25/074; H01L 25/0753; H01L 25/0756; H01L 2225/06562
See application file for complete search history.

(56) References Cited

U.S. PATENT DOCUMENTS 10,128,211 B2 11/2018 Chang et al.
2004/0238924 A1* 12/2004 Song ..................... H01L 23/522
257/678

(Continued)

Primary Examiner — Phat X Cao
(74) Attorney, Agent, or Firm — William Park & Associates Ltd.

(57) ABSTRACT

A semiconductor package may include: a chip stack including first to $N^{th}$ semiconductor chips stacked with an offset to one side such that edges thereof on the other side are exposed, and having first to $N^{th}$ chip pads disposed at the other-side edges, respectively; a bridge unit disposed adjacent to the other side of the chip stack and spaced apart from the chip stack; $k^{th}$ to $N^{th}$ wires extended in a vertical direction while one ends thereof are connected to the $k^{th}$ to $N^{th}$ chip pads among the first to Nth chip pads; first to $(k-1)^{th}$ wires having one ends connected to the first to $(k-1)^{th}$ chip pads among the first to $N^{th}$ chip pads; and an additional wire electrically coupled to the first to $(k-1)^{th}$ wires, and extended in the vertical direction while one end thereof is connected to the bridge unit.

21 Claims, 16 Drawing Sheets

(51) Int. Cl.
  *H01L 23/498* (2006.01)
  *H01L 23/31* (2006.01)
  *H01L 25/075* (2006.01)

(56) References Cited

U.S. PATENT DOCUMENTS

2019/0103357 A1* 4/2019 Lim .................... H01L 25/0657
2020/0066701 A1* 2/2020 Guo ........................ H01L 24/49
2020/0227386 A1* 7/2020 Kim .................... H01L 25/0657
2020/0381395 A1* 12/2020 Han ........................ H01L 25/50

* cited by examiner

SEMICONDUCTOR PACKAGE INCLUDING STACKED SEMICONDUCTOR CHIPS

CROSS-REFERENCE TO RELATED APPLICATION

This application claims priority under 35 U.S.C. § 119 to Korean Patent Application No. 10-2019-0118014 filed on Sep. 25, 2019, which is incorporated herein by reference in its entirety.

BACKGROUND

1. Technical Field

Various embodiments relate generally to a semiconductor package, and more particularly, to a semiconductor package including a plurality of chips stacked over a substrate.

2. Related Art

Electronic products are required to process a larger amount of data while having a smaller volume. Thus, it is necessary to increase the degree of integration of a semiconductor device used in such electronic products.

However, due to the limitations of the semiconductor integration technology, required functions cannot be satisfied by only a single semiconductor chip. Thus, a semiconductor package having a plurality of semiconductor chips embedded therein is fabricated.

Although a semiconductor package includes a plurality of semiconductor chips, the semiconductor package is required to have a designated size or a size smaller than the designated size, according to the requirements of an application in which the semiconductor package is to be mounted.

SUMMARY

In an embodiment, a semiconductor package may include: a chip stack including first to $N^{th}$ semiconductor chips stacked with an offset to one side such that edges thereof on the other side are exposed, and having first to $N^{th}$ chip pads disposed at the other-side edges, respectively, where N is a natural number equal to or more than 2; a bridge unit disposed adjacent to the other side of the chip stack and spaced apart from the chip stack; $k^{th}$ to $N^{th}$ wires extended in a vertical direction while one ends thereof are connected to the $k^{th}$ to $N^{th}$ chip pads among the first to Nth chip pads, where k is a natural number equal to or more than 2 and equal to or less than N; first to $(k-1)^{th}$ wires having one ends connected to the first to $(k-1)^{th}$ chip pads among the first to $N^{th}$ chip pads, wherein the other end of the first wire is connected to the bridge unit, and the other ends of the second to $(k-1)^{th}$ wires are connected to the bridge unit or the first to $(k-2)^{th}$ chip pads, respectively; and an additional wire electrically coupled to the first to $(k-1)^{th}$ wires, and extended in the vertical direction while one end thereof is connected to the bridge unit.

DETAILED DESCRIPTION

Figure 1A:
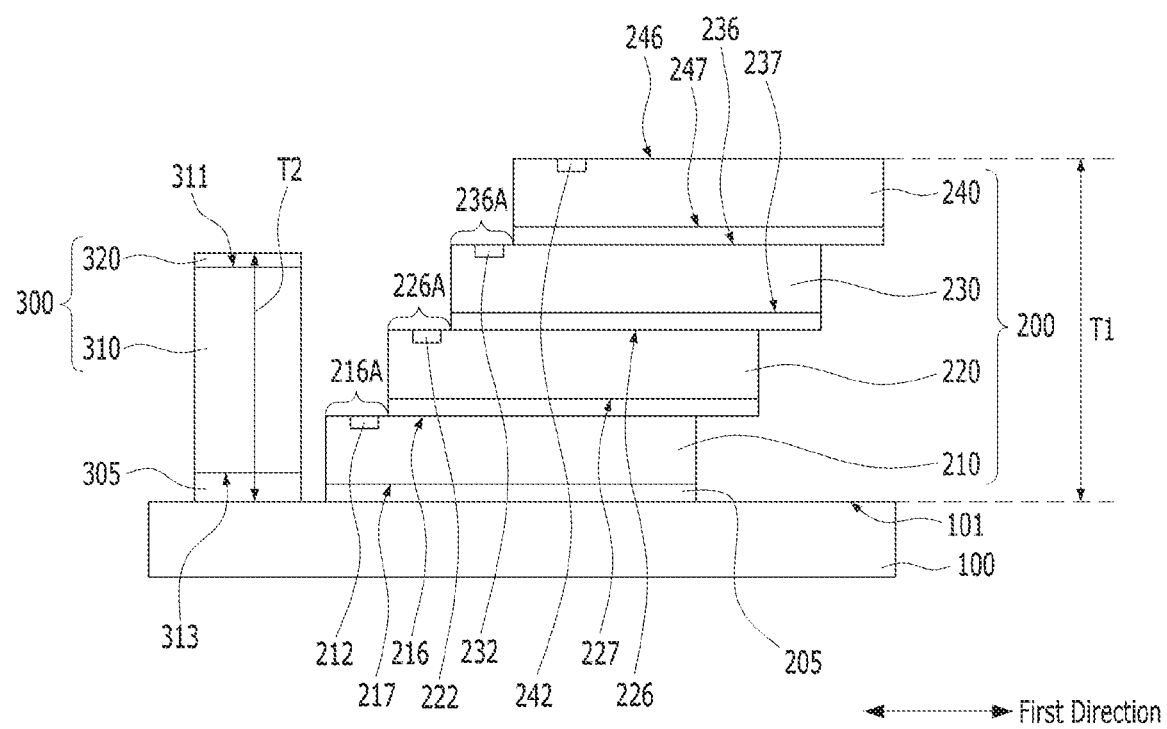
FIGS. 1A, 1B, 1C, 1D, 1E, 1F, 2A, 2B, 2C, 2D, 2E, 2F, 2G, 3, 4, and 5 are diagrams for describing a semiconductor package and a method for fabricating the same in accordance with an embodiment.

Various examples and implementations of the disclosed technology are described below in detail with reference to the accompanying drawings.

Various embodiments may be directed to a semiconductor package which can prevent a defect and facilitate a fabrication process, and a method for fabricating the same.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIGS. 1A to 1F, 2A to 2G and 3 to 5 are diagrams for describing a semiconductor package and a method for fabricating the same in accordance with an embodiment. FIGS. 1A, 2A, 2B, 3, 4 and 5 are cross-sectional views, and FIGS. 1B and 2C are plan views corresponding to FIGS. 1A and 2A/2B, respectively. FIGS. 1C to 1F are diagrams illustrating a redistribution layer of FIGS. 1A and 1B, and FIGS. 2D to 2G are diagrams illustrating the redistribution layer of FIGS. 1C to 1F and wires connected to the redistribution layer.

First, the fabrication method will be described.

Figure 1B:
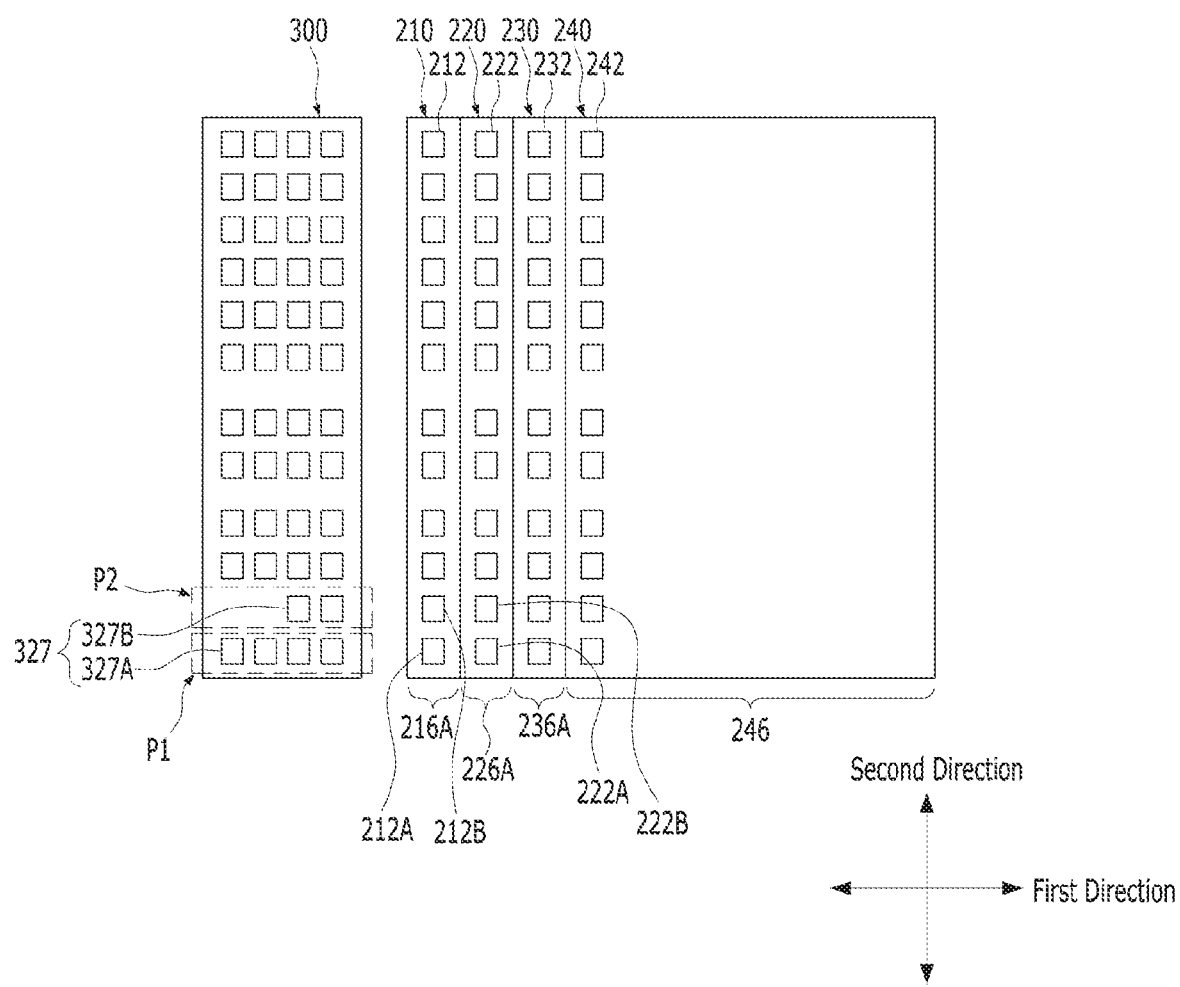

Referring to FIGS. 1A and 1B, a carrier substrate 100 may be provided. The carrier substrate 100 may be a glass carrier substrate, a ceramic carrier substrate or the like. Alternatively, the carrier substrate 100 may be a wafer, and a plurality of packages may be simultaneously formed on the carrier substrate 100.

Then, a chip stack 200 and a bridge unit 300 may be formed on a first surface 101 of the carrier substrate 100.

The chip stack 200 may include a plurality of semiconductor chips 210, 220, 230 and 240 stacked in a direction perpendicular to the first surface 101 of the carrier substrate 100. FIGS. 1A and 1B illustrate that one chip stack 200 includes four semiconductor chips 210, 220, 230 and 240. However, the present embodiments are not limited thereto, but the number of semiconductor chips included in one chip stack 200 may be set to various values. Hereafter, for convenience of description, the four semiconductor chips 210, 220, 230 and 240 will be referred to as a first semiconductor chip 210, a second semiconductor chip 220, a third semiconductor chip 230 and a fourth semiconductor chip 240, respectively, according to distances from the carrier substrate 100. Furthermore, for convenience of description, a position relatively close to the carrier substrate 100 in the vertical direction will be referred to as a bottom/lower position, and a position relatively far from the carrier substrate 100 will be referred to as a top/upper position. For example, the first semiconductor chip 210 may be referred to as being located at the lowermost part of the chip stack 200, and the fourth semiconductor chip 240 may be referred to as being located at the uppermost part of the chip stack 200.

The first to fourth semiconductor chips 210, 220, 230 and 240 may include first to fourth active surfaces 216, 226, 236 and 246 and first to fourth inactive surfaces 217, 227, 237 and 247, respectively. The first to fourth active surfaces 216, 226, 236 and 246 do not face the first surface 101 of the carrier substrate 100, and the first to fourth inactive surfaces 217, 227, 237 and 247 are located on the opposite side of the first to fourth active surfaces 216, 226, 236 and 246 so as to face the first surface 101 of the carrier substrate 100. The first to fourth semiconductor chips 210, 220, 230 and 240 may include first to fourth chip pads 212, 222, 232 and 242 disposed at the first to fourth active surfaces 216, 226, 236 and 246, respectively. The first to fourth chip pads 212, 222, 232 and 232 may be bonding pads for wiring bonding.

The first to fourth semiconductor chips 210, 220, 230 and 240 may be stacked with a predetermined offset to one side in a first direction, for example, the right side. As the first to fourth semiconductor chips 210, 220, 230 and 240 are stacked with the offset to the one side, other-side edges of the first to third active surfaces 216, 226 and 236 of the first to third semiconductor chips 210, 220 and 230 may be exposed. The other-side edges of the first to third active surfaces 216, 226 and 236 may be edges located on the opposite side of the one side in the offset direction, for example, the left edges. Hereafter, the exposed edges of the first to third active surfaces 216, 226 and 236 will be referred to as the exposed parts of the first to third active surfaces 216, 226 and 236, and represented by reference numerals 216A, 226A and 236A, respectively. The first to third chip pads 212, 222 and 232 may be disposed in the exposed parts 216A, 226A and 236A of the first to third active surfaces 216, 226 and 236, respectively. That is, the first to third semiconductor chips 210, 220 and 230 may be edge pad-type semiconductor chips. Since the fourth semiconductor chip 240 is located at the uppermost part of the chip stack 200, the entire fourth active surface 246 may be exposed. Therefore, the fourth chip pad 242 may be located at any position of the fourth active surface 246. In an embodiment, the fourth chip pad 242 may be located at substantially the same position as those of the first to third chip pads 212, 222 and 232, i.e. the left edge of the fourth active surface 246 of the fourth semiconductor chip 240. That is, the fourth semiconductor chip 240 may also be an edge pad-type semiconductor chip.

The cross-sectional view of FIG. 1A illustrates that each of the first to fourth chip pads 212, 222, 232 and 242 seems to be formed as one pad in the corresponding semiconductor chip of the first to fourth semiconductor chips 210, 220, 230 and 240. However, referring to the plan view of FIG. 1B, the plurality of first chip pads 212 may be arranged in the exposed part 216A of the first active surface 216 of the first semiconductor chip 210. The first chip pads may be spaced apart from each other in a second direction which is substantially perpendicular to the first direction while parallel to the first surface 101 of the carrier substrate 100. FIG. 1B illustrates that 12 first chip pads 212 are formed in a line, but the number and arrangement of the first chip pads 212 may be modified in various manners. Similarly, the plurality of second chip pads 222 may be arranged in the exposed part 226A of the second active surface 226 so as to be spaced apart from each other in the second direction, and the plurality of third chip pads 232 may be arranged in the exposed part 236A of the third active surface 236 so as to be spaced apart from each other in the second direction. The plurality of fourth chip pads 242 may be arranged at the left edge of the fourth active surface 246 so as to be spaced apart from each other in the second direction.

Among the plurality of chip pads included in each of the first to fourth semiconductor chips 210, 220, 230 and 240, a certain chip pad may be a signal pad to which an input/output signal is applied, and another chip pad may be a power pad to which a power voltage or ground voltage is applied. In an embodiment, FIG. 1B illustrates the case in which the lowermost first chip pad 212 of the plurality of first chip pads 212 is a signal pad, with regard to the second direction, and the first chip pad 212 over the signal pad is a power pad. For convenience of description, among the first chip pads 212, the signal pad will be referred to as a first signal pad 212A, and the power pad will be referred to as a first power pad 212B. In an embodiment, FIG. 1B illustrates the case in which the lowermost second chip pad 222 of the plurality of second chip pads 222 is a signal pad, from the perspective of the second direction, and the second chip pad 222 over the signal pad is a power pad. For convenience of description, among the second chip pads 222, the signal pad will be referred to as a second signal pad 222A, and the power pad will be referred to as a second power pad 222B. In an embodiment, the first signal pad 212A of the first semiconductor chip 210 and the second signal pad 222A of the second semiconductor chip 220 may be formed at positions corresponding to each other, and the first power pad 212B of the first semiconductor chip 210 and the second power pad 222B of the second semiconductor chip 220 may be formed at positions corresponding to each other. However, the present embodiments are not limited thereto, but the number and position of the signal pads and the number and position of the power pads in each of the semiconductor chips may be modified in various manners.

The first to fourth semiconductor chips 210, 220, 230 and 240 may be the same chips. The first to fourth semiconductor chips 210, 220, 230 and 240 may be memory chips. For example, the first to fourth semiconductor chips 210, 220, 230 and 240 may be NAND flash memory chips. However, the present embodiments are not limited thereto, but each of the first to fourth semiconductor chips 210, 220, 230 and 240 may include a nonvolatile memory chip such as a phase change random access memory (PRAM) and a magneto-resistive RAM or a volatile memory chip such as a dynamic RAM (DRAM), a mobile DRAM and a static RAM (SRAM).

On each of the first to fourth inactive surfaces 217, 227, 237 and 247 of the first to fourth semiconductor chips 210, 220, 230 and 240, an adhesive layer 205 may be formed. By the adhesive layer 205, the first to fourth semiconductor chips 210, 220, 230 and 240 may be attached to the first surface 101 of the carrier substrate 100 and the first to third active surfaces 216, 226 and 236 of the first to third semiconductor chips 210, 220 and 230, respectively. The adhesive layer 205 may include a dielectric adhesive material such as a die attach film (DAF).

The bridge unit 300 may be formed on the first surface 101 of the carrier substrate 100 so as to be spaced apart from the chip stack 200. In particular, the bridge unit 300 may be disposed on a side close to the first to fourth chip pads 212, 222, 232 and 242 between both sides of the chip stack 200 in the first direction. This is in order to electrically couple some of wires connected to the first to fourth chip pads 212, 222, 232 and 242 to the bridge unit 300. In an embodiment, the first to fourth semiconductor chips 210, 220, 230 and 240 of the chip stack 200 may be stacked with the offset to the right, such that the first to fourth chip pads 212, 222, 232 and 242 are disposed at the left edges of the first to fourth semiconductor chips 210, 220, 230 and 240. Therefore, the bridge unit 300 may be disposed on the left of the chip stack 200. In an embodiment, however, the first to fourth semiconductor chips 210, 220, 230 and 240 of the chip stack 200 may be stacked with an offset to the left, such that the first to fourth chip pads 212, 222, 232 and 242 are disposed at the right edges of the first to fourth semiconductor chips 210, 220, 230 and 240. In this case, the bridge unit 300 may be disposed on the right of the chip stack 200.

The bridge unit 300 may include a body part 310 and a redistribution layer 320 on the body part 310.

The body part 310 may include a second surface 313 facing the first surface 101 of the carrier substrate 100 and a first surface 311 located on the opposite side of the second surface 313. The redistribution layer 320 may be formed on the first surface 311 of the body part 310, and an adhesive layer 305 may be formed on the second surface 313 of the body part 310 so as to attach the body part 310 to the carrier substrate 100.

The body part 310 may be a kind of dummy which performs no electrical functions and is electrically insulated from components within the package, for example, the redistribution layer 320, the chip stack 200 and the like. However, the body part 310 may serve to provide a predetermined thickness to satisfy a thickness T2 requested by the bridge unit 300, and provide a predetermined area to provide a region where the redistribution layer 320 is to be formed. The body part 310 may be a block formed of a material including, for example but not limited to, silicon, glass, ceramic, or some combination thereof.

The redistribution layer 320 may include a plurality of redistribution pads 327 which are arranged in a matrix shape in the first and second directions. When the redistribution pads 327 arranged in the first direction are referred to as a row of the redistribution pads 327, a certain row of redistribution pads 327 may include first redistribution pads 327A (see P1), and another row of redistribution pads 327 may include second redistribution pads 327B (see P2). The first redistribution pads 327A may be connected to the signal pads, for example, the first and second signal pads 212A and 222A. The row of the first redistribution pads 327A may be formed at a position corresponding to the first and second signal pads 212A and 222A. The second redistribution pads 327B may be connected to the power pads, for example, the first and second power pads 212B and 222B. The row of the second redistribution pads 327B may be formed at a position corresponding to the first and second power pads 212B and 222B. Such a redistribution layer 320 will be described with reference to FIGS. 1C to 1F.

Figure 1C:
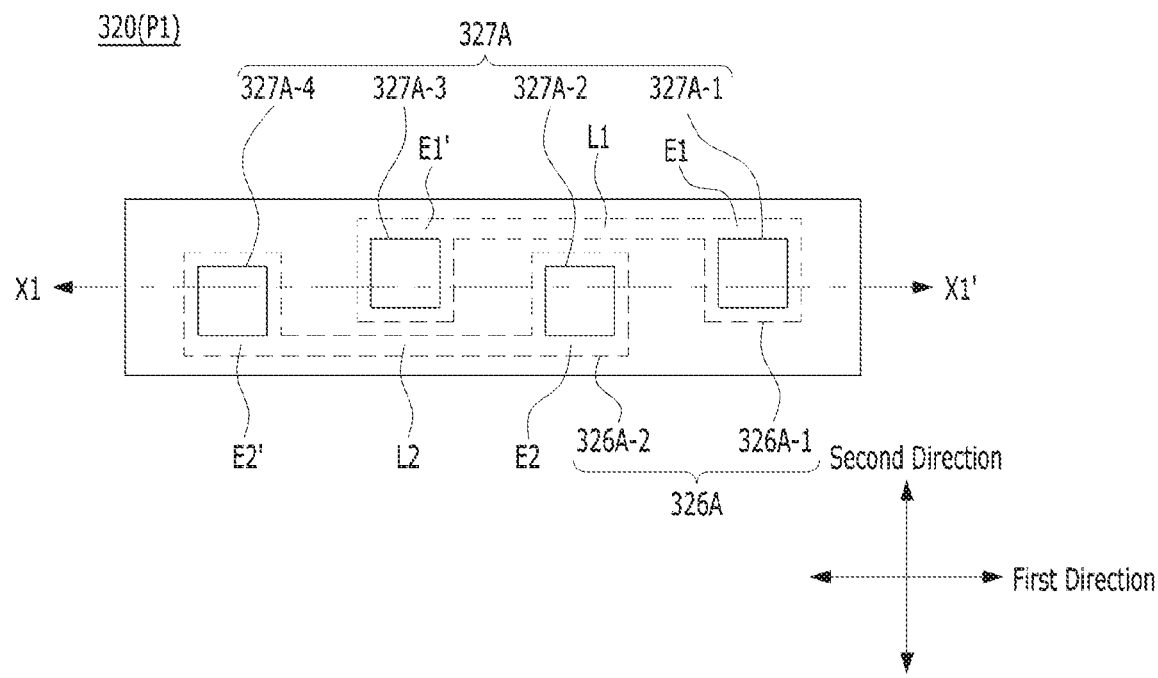
Figure 1D:
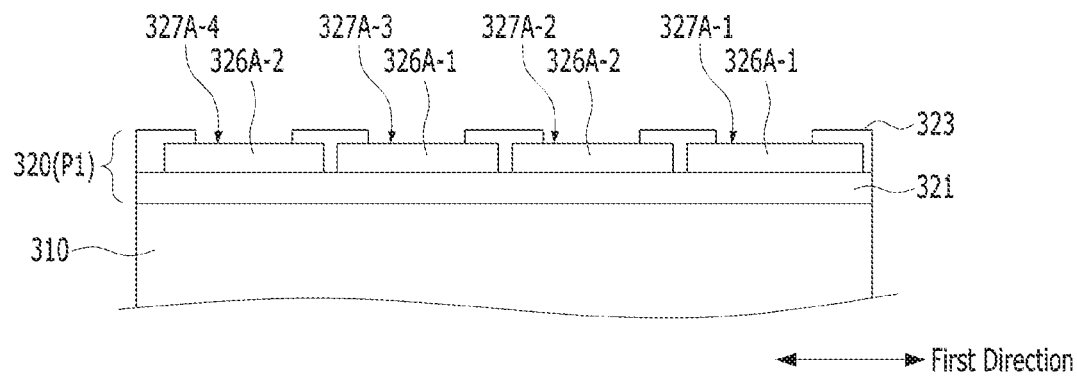
Figure 1E:
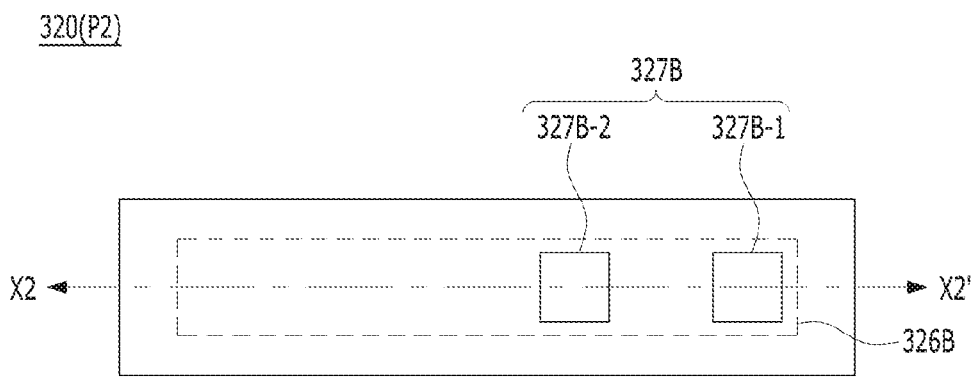
Figure 1E:
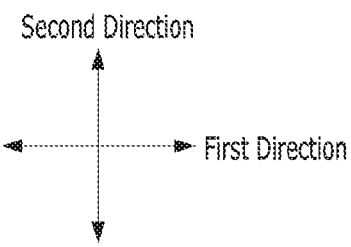
Figure 1F:
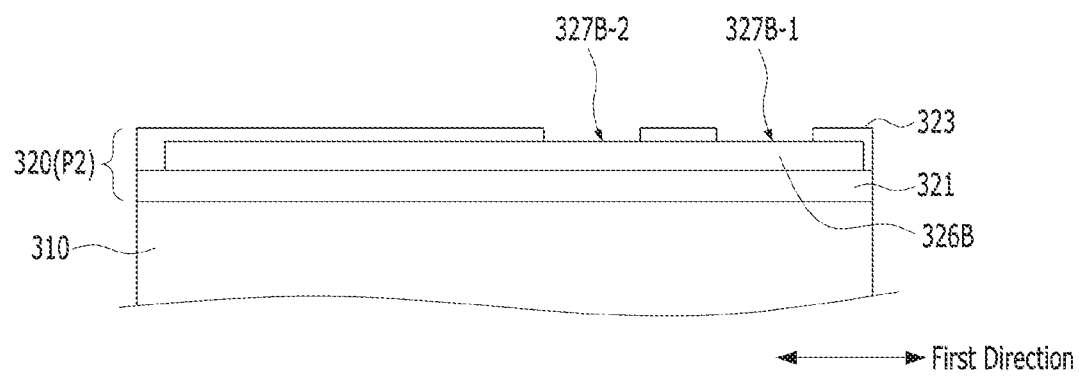

FIG. 1C is a plan view of the redistribution layer 320, illustrated based on the row of the first redistribution pads 327A in FIG. 1B, FIG. 1D is a cross-sectional view taken along the line X1-X1' of FIG. 1C, FIG. 1E is a plan view of the redistribution layer 320, illustrated based on the row of the second redistribution pads 327B in FIG. 1B, and FIG. 1F is a cross-sectional view taken along the line X2-X2' of FIG. 1E.

First, referring to FIGS. 1C and 1D with FIGS. 1A and 1B, the redistribution layer 320 may include a first redistribution dielectric layer 321 formed on the first surface 311 of the body part 310, a first redistribution conductive layer 326A formed on the first redistribution dielectric layer 321, and a second redistribution dielectric layer 323 formed on the first redistribution dielectric layer 321 and the first redistribution conductive layer 326A and having openings to expose portions of the first redistribution conductive layer 326A.

The first redistribution dielectric layer 321 may cover the entire first surface 311 of the body part 310 to insulate the first redistribution conductive layer 326A and the body part 310 from each other.

The first redistribution conductive layer 326A may include a first conductive layer 326A-1 and a second conductive layer 326A-2 which are spaced apart from each other in the second direction. The first conductive layer 326A-1 may be a portion to be connected to the first signal pad 212A, and the second conductive layer 326A-2 may be a portion to be connected to the second signal pad 222A. Since different signal pads need to be electrically isolated from each other, the first and second conductive layers 326A-1 and 326A-2 may be spaced apart from each other and electrically insulated from each other.

The first conductive layer 326A-1 may include a line-shaped connection part L1 and plate-shaped first and second end parts E1 and E1'. The connection part L1 may have a relatively small width while extended in the first direction, and the first and second end parts E1 and E1' may have a relatively large width while located at both ends of the connection part L1. The second conductive layer 326A-2 may include a line-shaped connection part L2 and plate-shaped first and second end parts E2 and E2'. The line-shaped connection part L2 may have a relatively small width while extended in the first direction, and the first and second end parts E2 and E2' may have a relatively large width while located on both sides of the connection part L2.

The first and second end parts E1 and E1' of the first conductive layer 326A-1 and the first and second end parts E2 and E2' of the second conductive layer 326A-2 may have surfaces which overlap the openings of the second redistribution dielectric layer 323 so as to be exposed through the openings, respectively. The exposed portions of the first and second end parts E1 and E1' of the first conductive layer 326A-1 and the first and second end parts E2 and E2' of the second conductive layer 326A-2, which are exposed through the openings of the second redistribution dielectric layer 323, may constitute the above-described first redistribution pads 327A. For example, the exposed portion of the first end part E1 of the first conductive layer 326A-1, which is to be connected to the first signal pad 212A through a wire, will be hereafter referred to as a first signal redistribution pad 327A-1. The exposed portion of the first end part E2 of the second conductive layer 326A-2, which is to be connected to the second signal pad 222A through a wire, will be hereafter referred to as a second signal redistribution pad 327A-2. The exposed portion of the second end part E1' of the first conductive layer 326A-1, which can be electrically coupled to the first signal pad 212A through the connection part L1, will be hereafter referred to as a first another signal redistribution pad 327A-3. The exposed portion of the second end part E2' of the second conductive layer 326A-2, which can be electrically coupled to the second signal pad 222A through the connection part L2, will be hereafter referred to as a second another signal redistribution pad 327A-4.

The first conductive layer 326A-1 may be disposed closer to one side in the second direction, for example, the top side than the second conductive layer 326A-2. The first and second end parts E1 and E1' of the first conductive layer 326A-1 may protrude further to the other side in the second direction, for example, the bottom side than the connection part L1. The first and second end parts E2 and E2' of the second conductive layer 326A-2 may protrude further to the one side in the second direction, for example, the top side than the connection part L2. Furthermore, the first and second end parts E1 and E1' of the first conductive layer 326A-1 and the first and second end parts E2 and E2' of the second conductive layer 326A-2 may be alternately disposed toward the left side from the right side. In this case, the first end part E2 of the second conductive layer 326A-2 may be disposed between the first and second end parts E1 and E1' of the first conductive layer 326A-1, and the second end part E1' of the first conductive layer 326A-1 may be disposed between the first and second end parts E2 and E2' of the second conductive layer 326A-2. Therefore, the first signal redistribution pad 327A-1, the second signal redistribution pad 327A-2, the first another signal redistribution pad 327A-3 and the second another signal redistribution pad 327A-4 may be located on a straight line, for example, the line X1-X1', while sequentially arranged in a direction from right to left.

The second redistribution dielectric layer 323 may be formed to cover the first redistribution conductive layer 326A and the first redistribution dielectric layer 321, except the four openings that expose the first and second end parts E1 and E1' of the first conductive layer 326A-1 and the first and second end parts E2 and E2' of the second conductive layer 326A-2, respectively.

Next, referring to FIGS. 1E and 1F with FIGS. 1A and 1B, the redistribution layer 320 may include the first redistribution dielectric layer 321, a second redistribution conductive layer 326B formed on the first redistribution dielectric layer 321, and a second redistribution dielectric layer 323 formed on the first redistribution dielectric layer 321 and the second redistribution conductive layer 326B and having openings to expose portions of the second redistribution conductive layer 326B.

The second redistribution conductive layer 326B may be a portion to be connected to the first and second power pads 212B and 222B. The first and second power pads 212B and 222B may be ground pads. Alternatively, the first and second power pads 212B and 222B may be pads to provide power. The ground pads may be electrically coupled to each other. Furthermore, the power pads may be electrically coupled to each other. Thus, the second redistribution conductive layer 326B may be connected to the first and second power pads 212B and 222B in common through a wire. For example, although described below, the second redistribution conductive layer 326B may be directly connected to a wire connected to the first power pad 212B, and not directly connected to a wire connected to the second power pad 222B. As the wire connected to the second power pad 222B is connected to the first power pad 212B, the second power pad 222B may be connected to the second redistribution conductive layer 326B via the first power pad 212B.

The second redistribution conductive layer 326B may have a bar shape of which the width in the first direction is larger than the width in the second direction, or a shape similar to the bar shape. The second redistribution conductive layer 326B may have a surface which overlaps the openings of the second redistribution dielectric layer 323 and is exposed through the openings. The portions of the second redistribution conductive layer 326B, which are exposed through the openings of the second redistribution dielectric layer 323, may constitute the above-described second redistribution pads 327B. The second redistribution pads 327B may include a power redistribution pad 327B-1 to be connected to the first power pad 212B through a wire and another power redistribution pad 327B-2 which can be electrically coupled to the first power pad 212B by the second redistribution conductive layer 326B.

The power redistribution pad 327B-1 and the another power redistribution pad 327B-2 may be sequentially arranged toward the left side from the right side, and arranged in a line on a straight line, for example, the line X2-X2'. The power redistribution pad 327B-1 and the another power redistribution pad 327B-2 may be disposed relatively close to the chip stack 200, i.e. to the right side.

Referring back to FIGS. 1A and 1B, the sum of the number of rows of the first redistribution pads 327A and the number of rows of the second redistribution pads 327B may be substantially equal to the number of the first chip pads 212 arranged in the second direction and/or the number of the second chip pads 222 arranged in the second direction. In an embodiment, FIG. 1B illustrates the case in which the row of the second redistribution pads 327B is disposed as one row at the second place from the bottom in the second direction, and the other rows are the rows of the first redistribution pads 327A. However, the relative numbers and layouts thereof may be modified in various manners.

The thickness of the chip stack 200, i.e. the distance from the first surface 101 of the carrier substrate 100 to the top surface of the fourth semiconductor chip 240, or the distance from the bottom surface of the lowermost adhesive layer 205 to the top surface of the fourth semiconductor chip 240, may be referred to as a first thickness T1. When the adhesive layer 205 is omitted, the thickness T1 of the chip stack 200 may correspond to the distance from the bottom surface of the first semiconductor chip 210 to the top surface of the fourth semiconductor chip 240. The thickness of the bridge unit 300, i.e. the distance from the first surface 101 of the carrier substrate 100 to the top surface of the redistribution layer 320 or the distance from the bottom surface of the adhesive layer 305 to the top surface of the redistribution layer 320, may be referred to as a second thickness T2. When the adhesive layer 305 is omitted, the thickness T2 of the bridge unit 300 may correspond to the distance from the bottom surface of the body part 310 to the top surface of the redistribution layer 320. The second thickness T2 may be equal to or less than the first thickness T1. Also, the second thickness T2 may be larger than the total thickness of semiconductor chips to be connected to the bridge unit 300, for example, the first and second semiconductor chips 210 and 220. In this case, vertical wires (see reference numerals 314 and 324 of FIG. 2A) which are indirectly connected to the first and second semiconductor chips 210 and 220 through the bridge unit 300 may have smaller lengths than vertical wires which are directly connected to the first and second semiconductor chips 210 and 220. Therefore, sweeping of the vertical wires can be reduced.

Subsequently, referring to FIGS. 2A to 2C, first to fourth wires 214, 224, 234 and 244 connected to the first to fourth chip pads 212, 222, 232 and 242, respectively, and first to third additional wires 314, 324 and 334 connected to some of the redistribution pads 327 of the redistribution layer 320 may be formed.

Among the first to fourth wires 214, 224, 234 and 244, the first and second wires 214 and 224 connected to the first and second chip pads 212 and 222 of the first and second semiconductor chips 210 and 220 may be bent toward the redistribution layer 320 to be connected to the redistribution layer 320. On the other hand, the third and fourth wires 234 and 244 connected to the third and fourth chip pads 232 and 242 of the third and fourth semiconductor chips 230 and 240 may be extended in the vertical direction. Furthermore, the first to third additional wires 314, 324 and 334 may be extended in the vertical direction.

The first and second wires 214 and 224 may be formed through a wire bonding process. The third and fourth wires 234 and 244 and the first to third additional wires 314, 324 and 334 may be formed through a vertical wire forming process. The vertical wire forming process will be described as follows. First, one end of a wire may be bonded to a chip pad by a wire bonding machine (not illustrated). The wire may include a metal such as gold, silver, copper and platinum, or alloys thereof, which can be welded to the chip pad by ultrasonic energy and/or heat. Then, the other end of the wire may be pulled in the vertical direction away from the chip pad, for example, from bottom to top, by the wire bonding machine. When the other end of the wire is extended to a desired position, the other end of the wire may be cut.

The third and fourth wires 234 and 244 may have one ends connected to the third and fourth chip pads 232 and 242, respectively, and the other ends located on the opposite side of the one ends and located at a higher level than the top surface of the chip stack 200, i.e. the fourth active surface 246 of the fourth semiconductor chip 240. In an embodiment, the other ends of the third and fourth wires 234 and 244 may be located at the same distance from the first surface 101 of the carrier substrate 100, i.e. at the same height. However, the present embodiments are not limited thereto, and the other ends of the third and fourth wires 234 and 244 may be located at different heights under the supposition that the other ends of the third and fourth wires 234 and 244 are located at a higher level than the fourth active surface 246. Since the third and fourth wires 234 and 244 are connected to the third and fourth semiconductor chips 230 and 240, respectively, which are formed at relatively long distances from the carrier substrate 100, the third and fourth wires 234 and 244 may have relatively small lengths.

The first wire 214 may have one end connected to the first chip pad 212 and the other end connected to the redistribution pad 327 of the redistribution layer 320. For example, the first wire 214 may include a first signal wire 214A and a first power wire 214B. The first signal wire 214A may have one end connected to the first signal pad 212A of the first chip pads 212 and the other end connected to one of the first redistribution pads 327A. The first power wire 214B may have one end connected to the first power pad 212B of the first chip pads 212 and the other end connected to one of the second redistribution pads 327B. The second wire 224 may have one end connected to the second chip pad 222 and the other end connected to the redistribution pad 327 of the redistribution layer 320 or the first chip pad 212. For example, the second wire 224 may include a second signal wire 224A and a second power wire 224B. The second signal wire 224A may have one end connected to the second signal pad 222A of the second chip pads 222 and the other end connected to one of the first redistribution pads 327A. The second power wire 224B may have one end connected to the second power pad 222B of the second chip pads 222 and the other end connected to the first power pad 212B of the first chip pads 212.

The first to third additional wires 314, 324 and 334 may have one ends connected to the redistribution pads 327 of the redistribution layer 320 and the other ends located on the opposite side of the one ends and located at a higher level than the top surface of the chip stack 200. In an embodiment, the other ends of the first to third additional wires 314, 324 and 334 may be located at the same height as the other ends of the third and fourth wires 234 and 244 while located at the same height. However, the present embodiments are not limited thereto, but the other ends of the first to third additional wires 314, 324 and 334 may be located at various heights under the supposition that the other ends of the first to third additional wires 314, 324 and 334 are located at a higher level than the fourth active surface 246. Since the first to third additional wires 314, 324 and 334 are connected to the redistribution layer 320 which is formed at a relatively long distance from the carrier substrate 100, the first to third additional wires 314, 324 and 334 may have relatively small lengths.

The connection relationships between the first and second wires 214 and 224 and the redistribution layer 320 and between the first to third additional wires 314, 324 and 334 and the redistribution layer 320 will be described with reference to FIGS. 2D to 2G which will be described below.

Figure 2A:
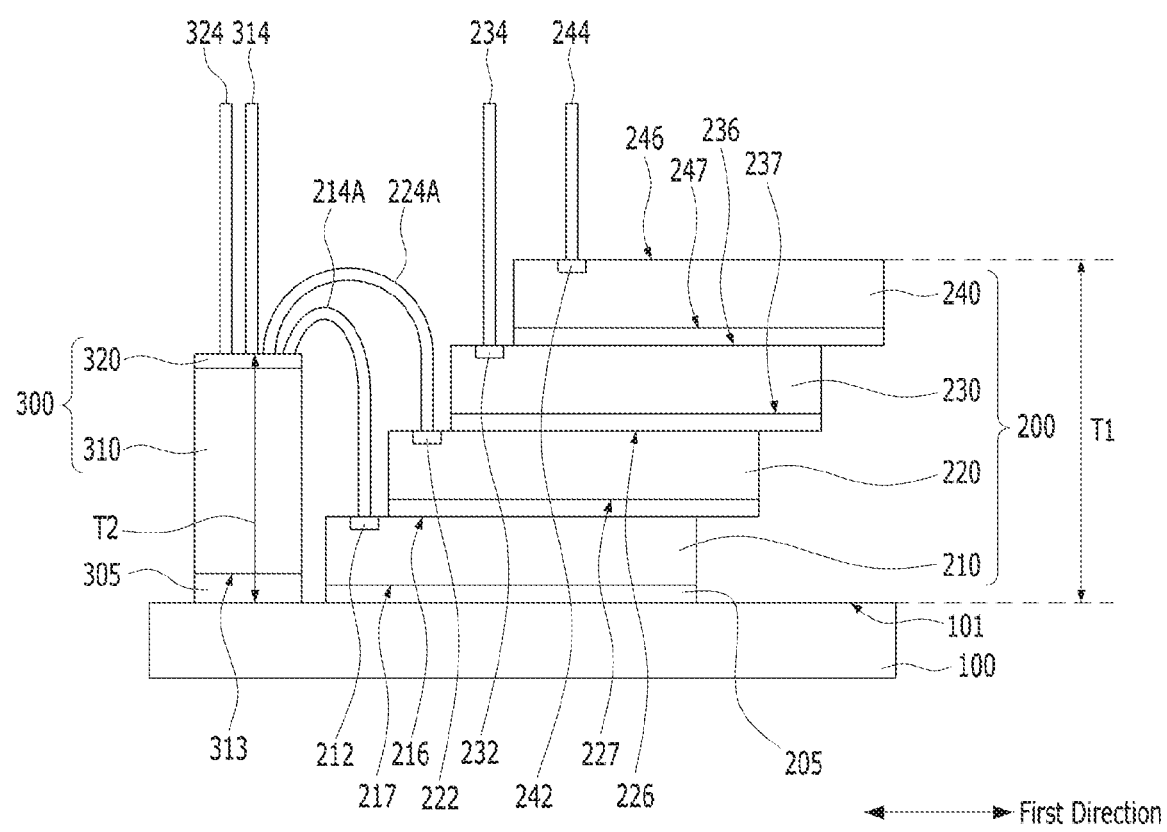
Figure 2B:
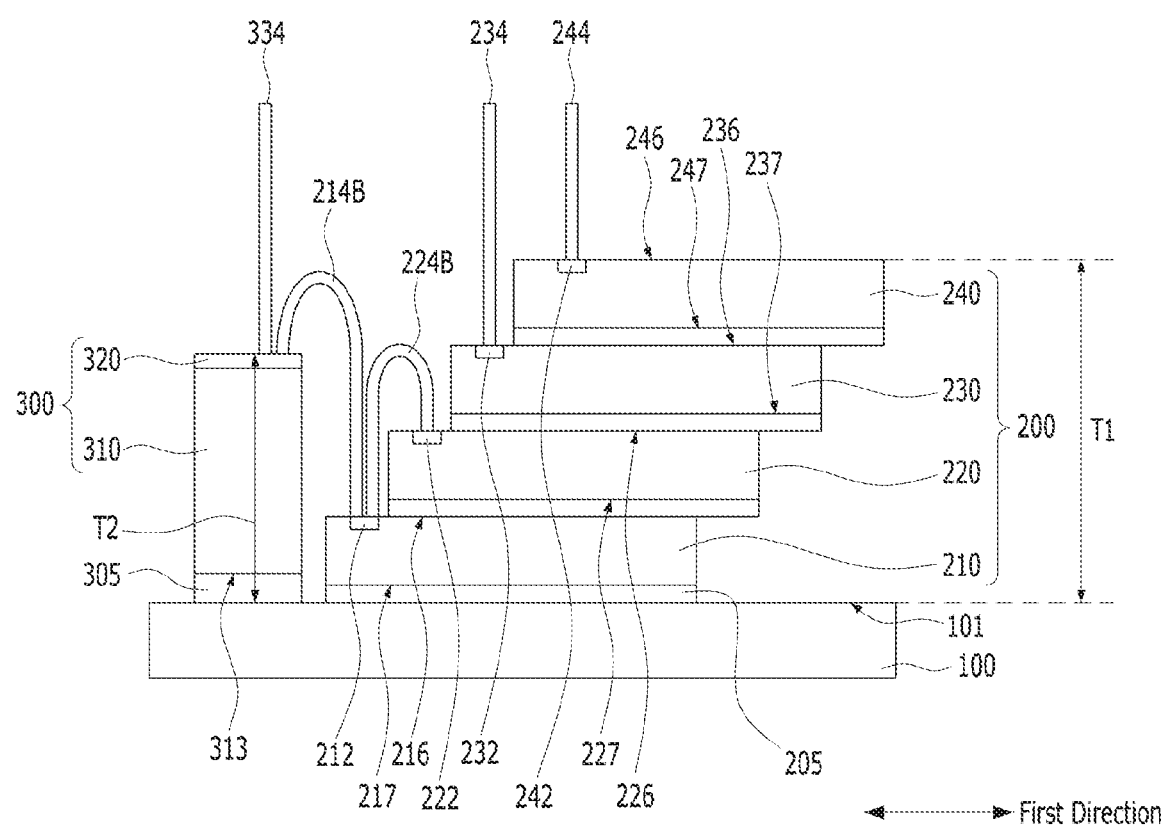
Figure 2C:
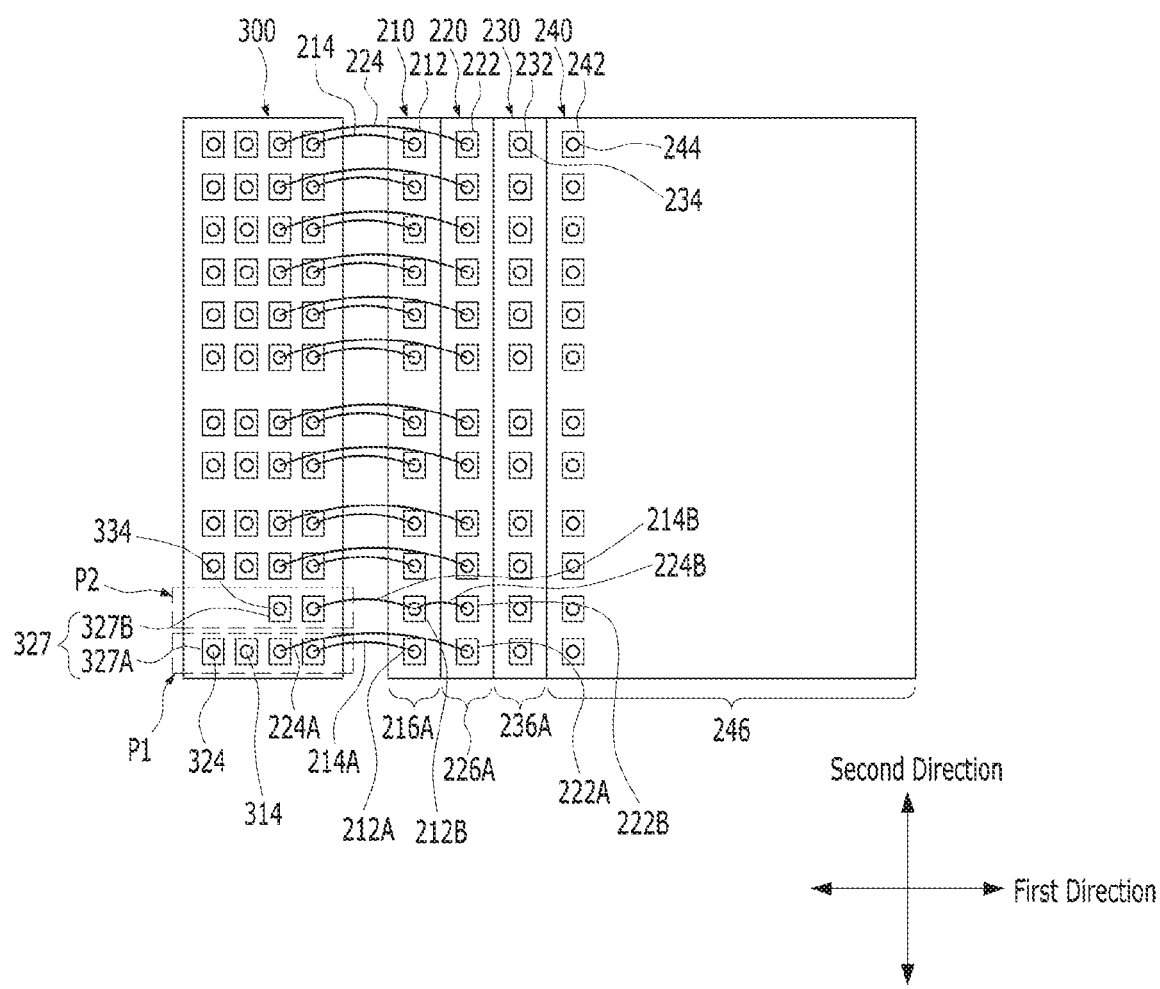
Figure 2D:
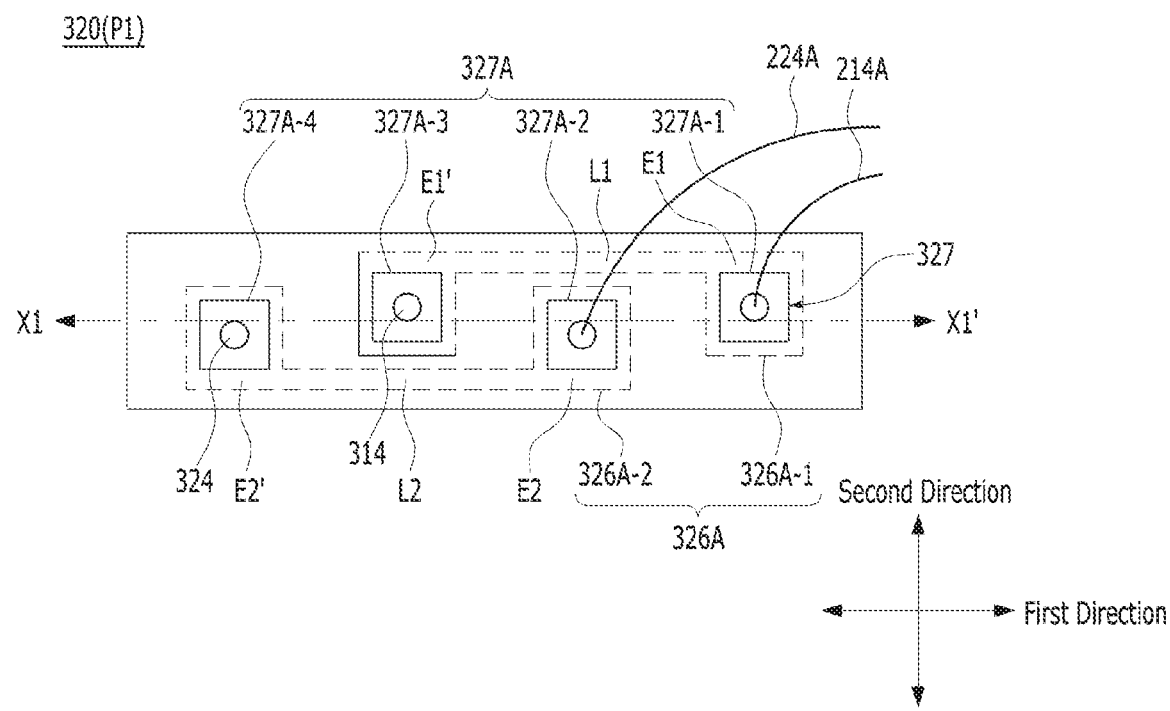
Figure 2E:
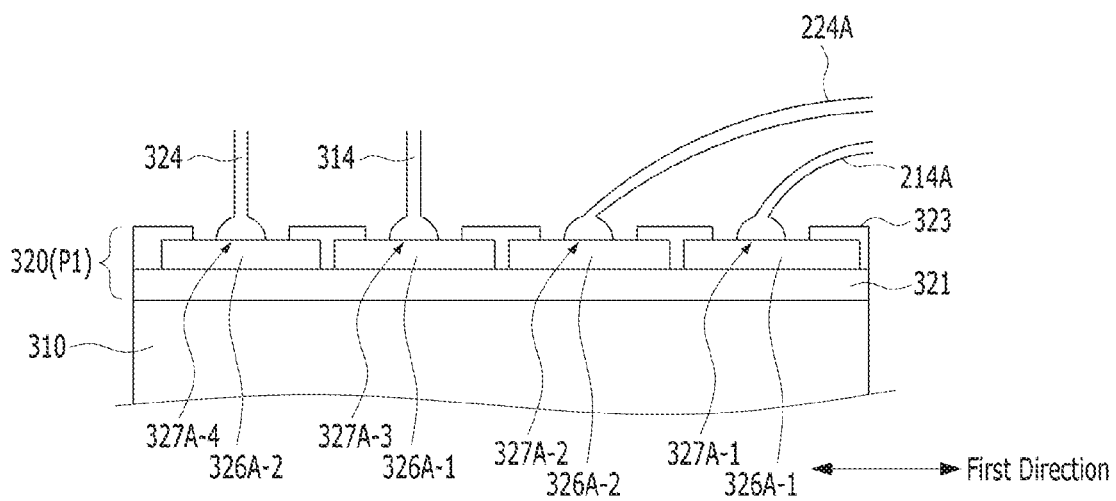
Figure 2F:
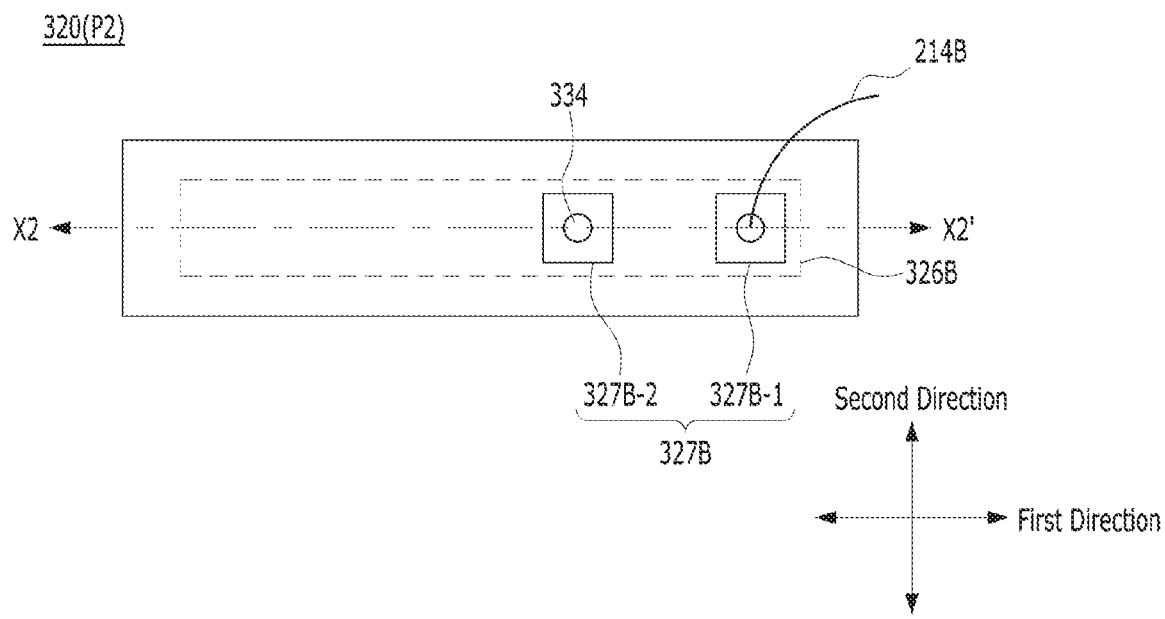
Figure 2G:
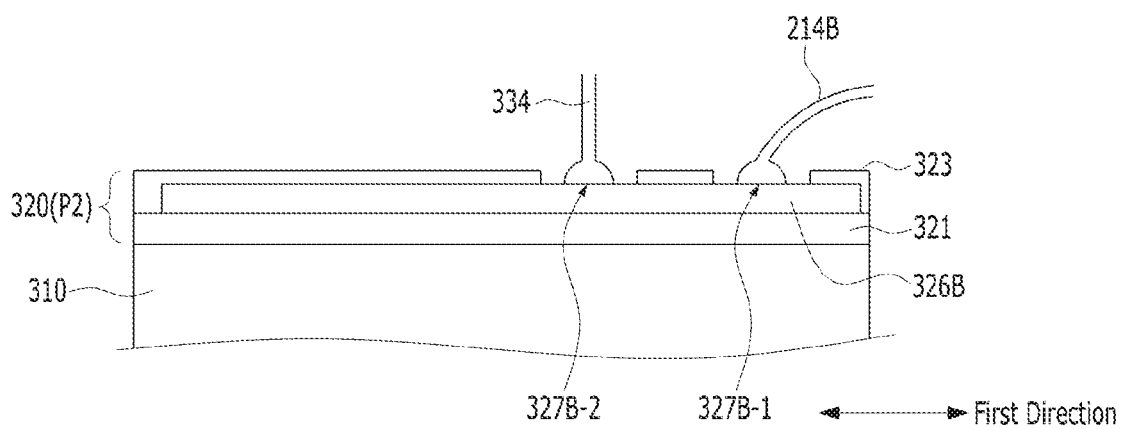

FIG. 2D is a plan view of the redistribution layer 320 and the wires connected to the redistribution layer 320, illustrated based on the row of the first redistribution pads 327A in FIG. 2C, FIG. 2E is a cross-sectional view taken along the line X1-X1' of FIG. 2D, FIG. 2F is a plan view of the redistribution layer 320 and the wires connected to the redistribution layer 320, illustrated based on the row of the second redistribution pads 327B in FIG. 2C, and FIG. 2G is a cross-sectional view taken along the line X2-X2' of FIG. 2F.

First, referring to FIGS. 2D and 2E with FIGS. 2A and 2C, the first redistribution pads 327A may include the first signal redistribution pad 327A-1, the second signal redistribution pad 327A-2, the first another signal redistribution pad 327A-3 and the second another signal redistribution pad 327A-4, which are sequentially arranged in a direction from left to right as described above.

The other end of the first signal wire 214A connected to the first signal pad 212A may be connected to the first signal redistribution pad 327A-1. That is, the first signal wire 214A may connect the first signal pad 212A and the first signal redistribution pad 327A-1 which are the closest to each other in the first direction.

The other end of the second signal wire 224A connected to the second signal pad 222A may be connected to the second signal redistribution pad 327A-2. That is, the second signal wire 224A may connect the second signal pad 222A and the second signal redistribution pad 327A-2 which are the second closest to each other in the first direction. The second signal wire 224A may be spaced a predetermined distance from the first signal wire 214A in the vertical direction and formed at a higher position than the first signal wire 214A, in order to prevent a short circuit to the first signal wire 214A.

The first additional wire 314 may have one end connected to the first another signal redistribution pad 327A-3. The first another signal redistribution pad 327A-3 may be connected to the first signal redistribution pad 327A-1 through the first conductive layer 326A-1. As a result, a signal path may be formed through the first signal pad 212A, the first signal wire 214A, the first conductive layer 326A-1 and the first additional wire 314.

The second additional wire 324 may have one end connected to the second another signal redistribution pad 327A-4. The second another signal redistribution pad 327A-4 may be connected to the second signal redistribution pad 327A-2 through the second conductive layer 326A-2. As a result, a signal path may be formed through the second signal pad 222A, the second signal wire 224A, the second conductive layer 326A-2 and the second additional wire 324.

Next, referring to FIGS. 2F and 2G with 2B and 2C, the second redistribution pads 327B may include the power redistribution pad 327B-1 and the another power redistribution pad 327B-2 which are sequentially arranged in the direction from right to left as described above.

The other end of the first power wire 214B connected to the first power pad 212B may be connected to the power redistribution pad 327B-1. That is, the first power wire 214B may connect the first power pad 212B and the power redistribution pad 327B-1 which are the closest to each other in the first direction.

On the other hand, the other end of the second power wire 224B connected to the second power pad 222B may not be directly connected to the second redistribution conductive layer 326B, but connected to the first power pad 212B.

The third additional wire 334 may have one end connected to the another power redistribution pad 327B-2. The another power redistribution pad 327B-2 may be connected to the power redistribution pad 327B-1 through the second redistribution conductive layer 326B. As a result, a power supply path may be formed through the second power pad 222B, the second power wire 224B, the first power pad 212B, the first power wire 214B, the second redistribution conductive layer 326B and the third additional wire 334.

Referring back to FIGS. 2A to 2C, the wires connected to the semiconductor chips located at relatively high levels among the first to fourth wires 214, 224, 234 and 244, for example, the third and fourth wires 234 and 244, may have relatively small lengths even though extended in the vertical direction. Therefore, an occurrence of sweeping may be prevented, or the sweeping degree may be small. However, the wires connected to the semiconductor chips located at relatively low levels among the first to fourth wires 214, 224, 234 and 244, for example, the first and second wires 214 and 224 may have relatively large lengths when extended in the vertical direction. The sweeping degree of the wires may be large. Therefore, in an embodiment, the first and second wires 214 and 224 may be connected to the bridge unit 300 in order to prevent sweeping of the first and second wires 214 and 224. The sweeping will be described with reference to FIG. 6 below.

Figure 6:
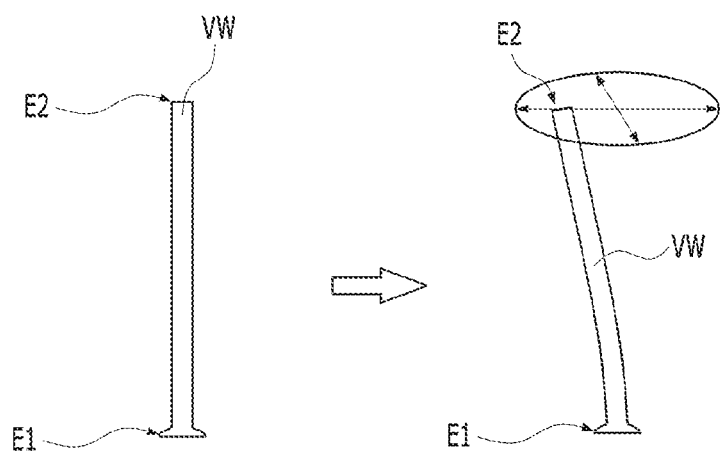
FIG. 6 is a diagram illustrating sweeping of a vertical wire.

FIG. 6 is a diagram illustrating sweeping of a vertical wire VW.

Referring to FIG. 6, the vertical wire VW may have one end E1 attached to a chip pad and the other end E2 located on the opposite side of the one end E1.

The left side of an arrow shows a state immediately after the vertical wire VW is formed. Such a vertical wire VW can maintain the state in which the vertical wire VW is erected in the vertical direction, as long as an external force is not applied.

The right side of the arrow shows a state after an external force, for example, pressure caused by a flow of molding material is applied to the vertical wire VW during a molding process. When such pressure is applied, the one end E1 of the vertical wire VW is not moved because the one end E1 is attached and fixed to the chip pad. However, the other end E2 of the vertical wire VW is moved in the direction that the pressure is applied, because the other end E2 is not fixed. Therefore, there may occur sweeping in which the vertical wire VW is bent. Due to the sweeping, the other end E2 of the vertical wire VW may be displaced to a random position within a concentric circle illustrated in FIG. 6. The displacement of the other end E2 of the vertical wire VW may be changed by a vortex of the molding material, which is caused by the injection direction and pressure of the molding material and the surrounding structures. Such sweeping may become severe as the length of the vertical wire VW is increased. When the vertical wire VW is swept, the vertical wire VW may be shorted to an adjacent vertical wire, or the connection between the vertical wire VW and the chip pad may be removed. Furthermore, since the position of the other end E2 of the vertical wire VW is changed, a component to be connected to the other end E2 of the vertical wire VW, for example, a redistribution layer 600 (see FIG. 6) may be misaligned from the other end E2 of the vertical wire VW. Thus, a connection defect may occur between the vertical wire VW and the redistribution layer.

Referring back to FIGS. 2A to 2C, when the wires connected to the first and second chip pads 212 and 222 are implemented as vertical wires, the wires may be swept more than the wires connected to the third and fourth chip pads 232 and 242, because the lengths of the wires connected to the first and second chip pads 212 and 222 are larger than the lengths of the wires connected to the third and fourth chip pads 232 and 242. In an embodiment, the first and second wires 214 and 224 may be connected to the bridge unit 300 on the one side of the chip stack 200. Since the one ends and the other ends of the first and second wires 214 and 224 are all fixed, sweeping can be prevented or reduced.

As the first to third additional wires 314, 324 and 334, which are extended in the vertical direction while connected to the first and second wires 214 and 224, are formed in the bridge unit 300, the first and second wires 214 and 224 may function as interconnections to transfer signals in the vertical direction, like the third and fourth wires 234 and 244.

Since the first to third additional wires 314, 324 and 334 are formed on the bridge unit 300 and thus have relatively small lengths like the third and fourth wires 234 and 244, sweeping can be prevented or reduced.

Figure 3:
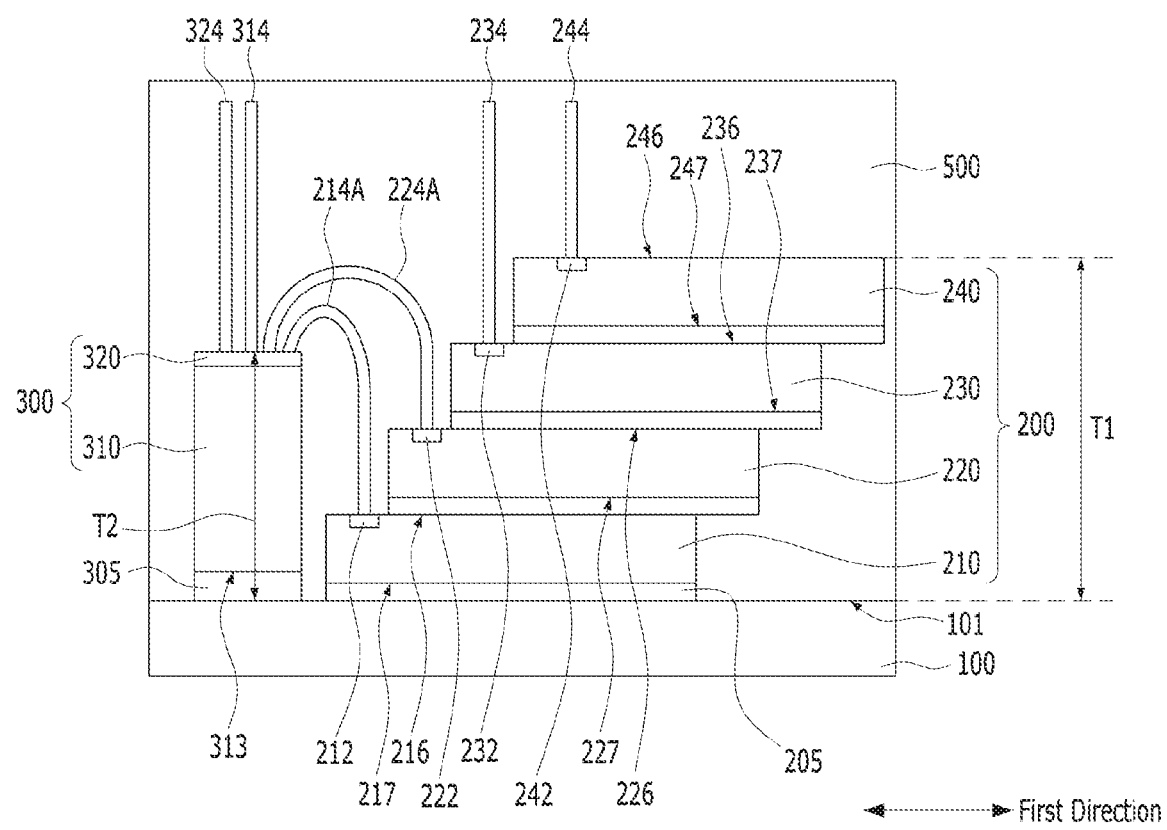

Referring to FIG. 3, a molding layer 500 may be formed on the carrier substrate 100 on which the chip stack 200, the bridge unit 300, the first to fourth wires 214, 224, 234 and 244 and the first to third additional wires 314, 324 and 334 are formed.

The molding layer 500 may be formed to have a thickness that sufficiently covers the chip stack 200 and the bridge unit 300. In an embodiment, the molding layer 500 may be formed to have a thickness that sufficiently covers the third and fourth wires 234 and 244 and the first to third additional wires 314, 324 and 334, which are vertical wires. In another embodiment, however, the molding layer 500 may have a thickness that exposes the other ends of the third and fourth wires 234 and 244 and the first to third additional wires 314, 324 and 334, under the supposition that the molding layer 500 covers the chip stack 200 and the bridge unit 300.

The molding layer 500 may be formed through a molding process of filling an empty space of a molding die (not illustrated) with a molding material and then curing the molding material. When the molding layer 500 is formed, pressure caused by a flow of the molding material may be applied to the first to fourth wires 214, 224, 234 and 244 and the first to third additional wires 314, 324 and 334. However, since the third and fourth wires 234 and 244 and the first to third additional wires 314, 324 and 334 have relatively small lengths, bending can be prevented and/or reduced. Furthermore, since both ends of the first and second wires 214 and 224 are fixed, bending can be prevented or reduced.

Figure 4:
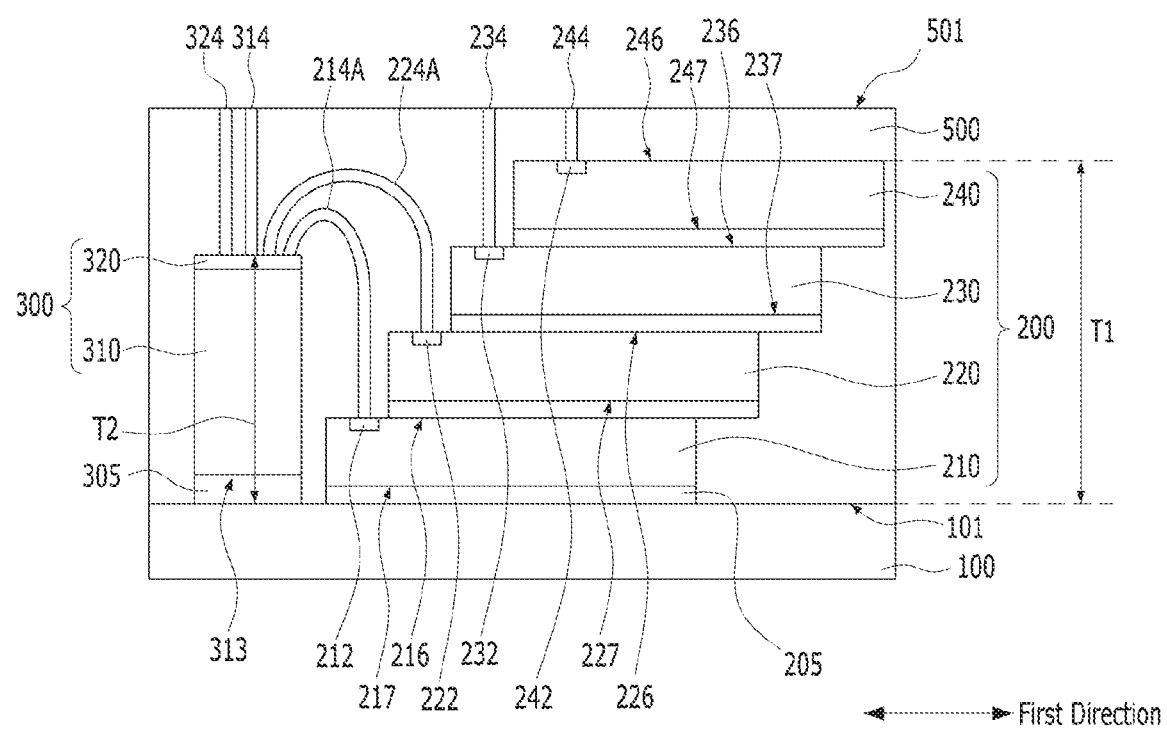

Referring to FIG. 4, a grinding process may be performed on the molding layer 500. The grinding process may include a mechanical or chemical polishing process.

Through the grinding process, the molding layer 500 may have a flat surface 501 located at a predetermined height from the first surface 101 of the carrier substrate 100. The height of the flat surface 501 may be larger than the height of the top surface of the chip stack 200. The other ends of the third and fourth wires 234 and 244 and the first to third additional wires 314, 324 and 334 may be exposed to the flat surface 501 while located at the same height as the flat surface 501 of the molding layer 500.

Figure 5:
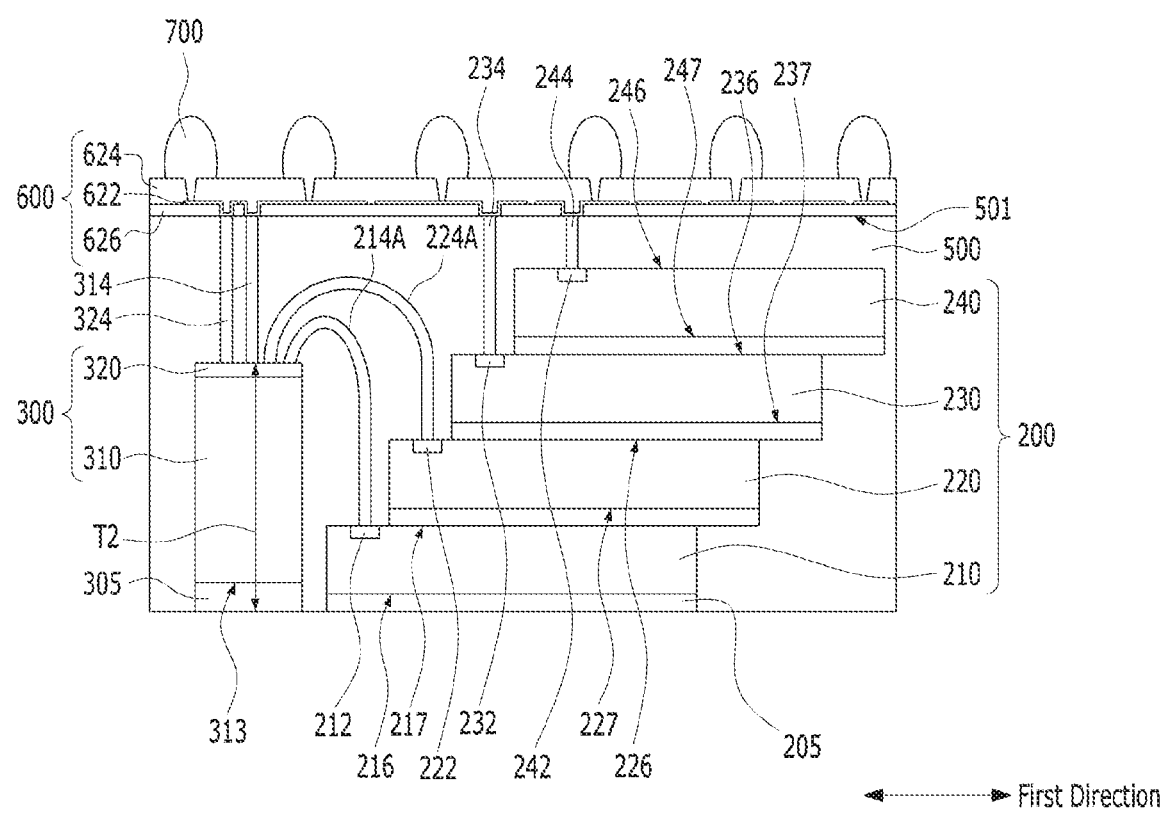

Referring to FIG. 5, a package redistribution layer 600 may be formed on the flat surface 501 of the molding layer 500.

The process of forming the package redistribution layer 600 will be described as follows. First, a first package redistribution dielectric layer 626 may be formed on the flat surface 501 of the molding layer 500. The first package redistribution dielectric layer 626 may be patterned to have openings that expose the other ends of the third and fourth wires 234 and 244 and the other ends of the first to third additional wires 314, 324 and 334. Then, a package redistribution conductive layer 622 may be formed on the first package redistribution dielectric layer 626. The package redistribution conductive layer 622 may be buried in the openings of the first package redistribution dielectric layer 626 so as to be electrically coupled to the other ends of the third and fourth wires 234 and 244 and the other ends of the first to third additional wires 314, 324 and 334, and patterned in various shapes. Then, a second package redistribution dielectric layer 624 may be formed on the first package redistribution dielectric layer 626 and the package redistribution conductive layer 622. The second package redistribution dielectric layer 624 may be patterned to have openings that expose portions of the package redistribution conductive layer 622.

Subsequently, external connection terminals 700 may be formed on the package redistribution layer 600 so as to be electrically coupled to the package redistribution conductive layer 622 through the openings of the second package redistribution dielectric layer 624. In an embodiment, solder balls may be used as the external connection terminals 700. However, the present embodiments are not limited thereto, but various types of electrical connectors may be used.

Then, the carrier substrate 100 may be removed. The carrier substrate 100 may be removed at any step after the molding layer 500 is formed.

Through the above-described process, the semiconductor package in accordance with an embodiment may be fabricated.

Referring back to FIG. 5 with FIG. 2C, the semiconductor package in accordance with an embodiment may include the chip stack 200, the bridge unit 300, the third and fourth wires 234 and 244, the first and second wires 214 and 224, and the first to third additional wires 314, 324 and 334. The chip stack 200 may include the first to fourth semiconductor chips 210, 220, 230 and 240 having the first to third chip pads 212, 222 and 232 formed at the other-side edges, for example, the left edges that are exposed as the semiconductor chips are stacked with the offset to one side, for example, the right side, i.e. the exposed parts 216A, 226A and 236A of the first to third active surfaces 216, 226 and 236, respectively, and the fourth chip pad 242 formed at the fourth active surface 246. The bridge unit 300 may be formed on the other side of the chip stack 200, for example, the left side so as to be spaced apart from the chip stack 200. In an embodiment, the bridge unit 300 may be formed adjacent to the other side of the chip stack 200 and spaced apart from the chip stack 200, for example, the left side so as to be spaced apart from the chip stack 200. The third and fourth wires 234 and 244 may be extended in the vertical direction while the one ends thereof are connected to the third and fourth chip pads 232 and 242. The first and second wires 214 and 224 may have one ends connected to the first and second chip pads 212 and 222 and the other ends connected to the bridge unit 300 or specifically the redistribution layer 320. The first to third additional wires 314, 324 and 334 may be extended in the vertical direction from the redistribution layer 320 while electrically coupled to the first and second wires 214 and 224 through the redistribution layer 320.

The semiconductor package in accordance with an embodiment may further include the package redistribution layer 600 and the external connection terminals 700 which are formed on the flat surface 501 of the molding layer 500. Since the package redistribution layer 600 can be formed in the region defined by the molding layer 500, the semiconductor package in accordance with an embodiment may be a fan-out semiconductor package.

Since the components of the semiconductor package have been already described while the fabrication method is described, the detailed descriptions thereof are omitted herein.

The semiconductor package and the method for fabricating the same, which have been described so far, may acquire the following effects.

First, in the semiconductor package including the plurality of stacked semiconductor chips which are required to be connected to the vertical wires having various lengths, the vertical wires having relatively large lengths may be replaced with the wires connected to the bridge unit and the vertical wires extended from the bridge unit. Thus, the lengths of the vertical wires in the semiconductor package may be set to relatively small lengths. As a result, sweeping of the vertical wires can be prevented and/or reduced, which makes it possible to prevent various defects.

Furthermore, the structure of the redistribution layer of the bridge unit and the layout of the wires connected to the redistribution layer can be optimized to facilitate the fabrication process of the semiconductor package.

In an embodiment, it has been described that one bridge unit corresponding to one chip stack is formed. However, two or more chip stacks may share one bridge unit. This structure will be described with reference to FIGS. 7A and 7B.

Figure 7A:
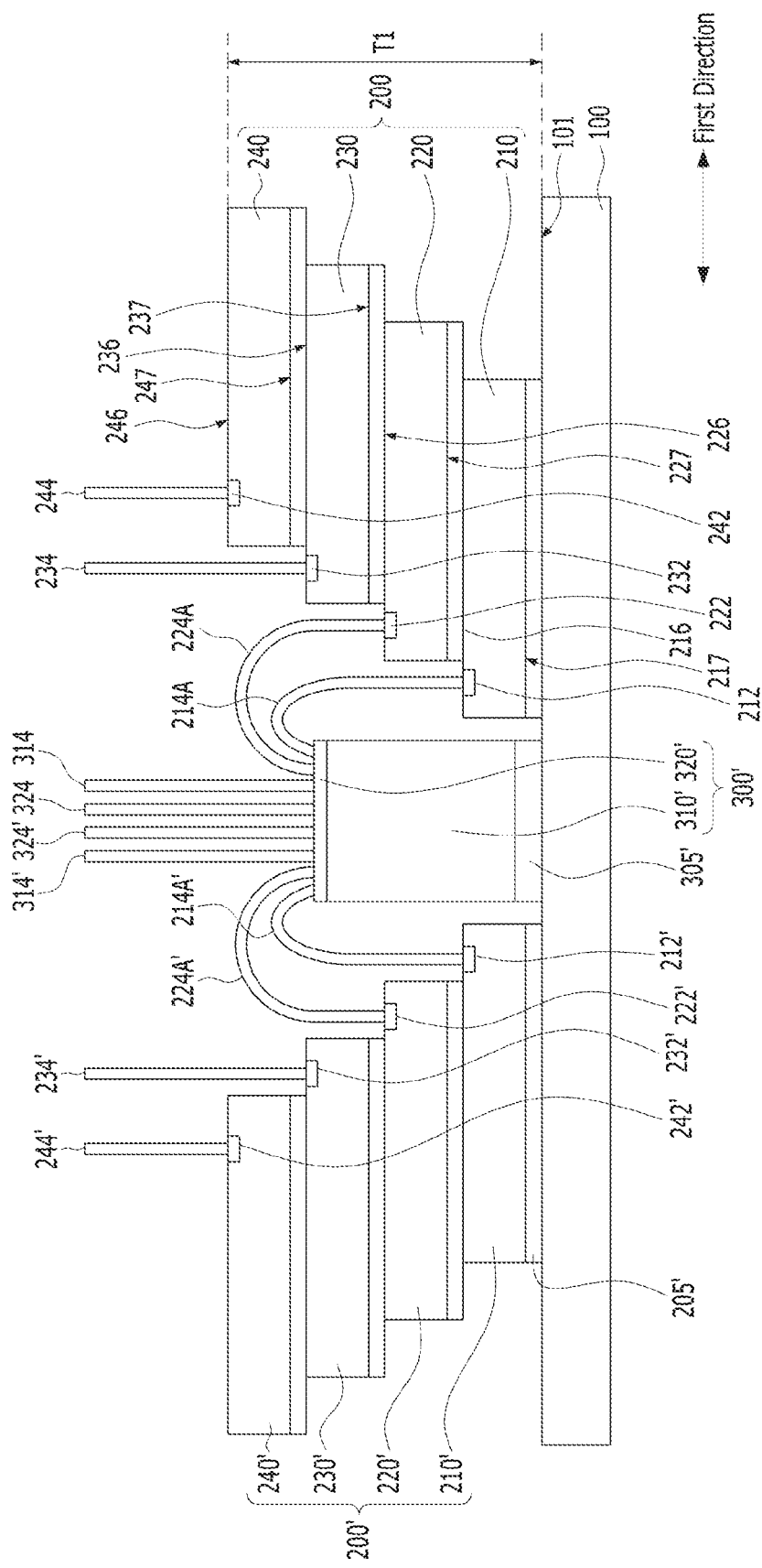
FIGS. 7A and 7B are cross-sectional and plan views illustrating a semiconductor package in accordance with an embodiment.
Figure 7B:
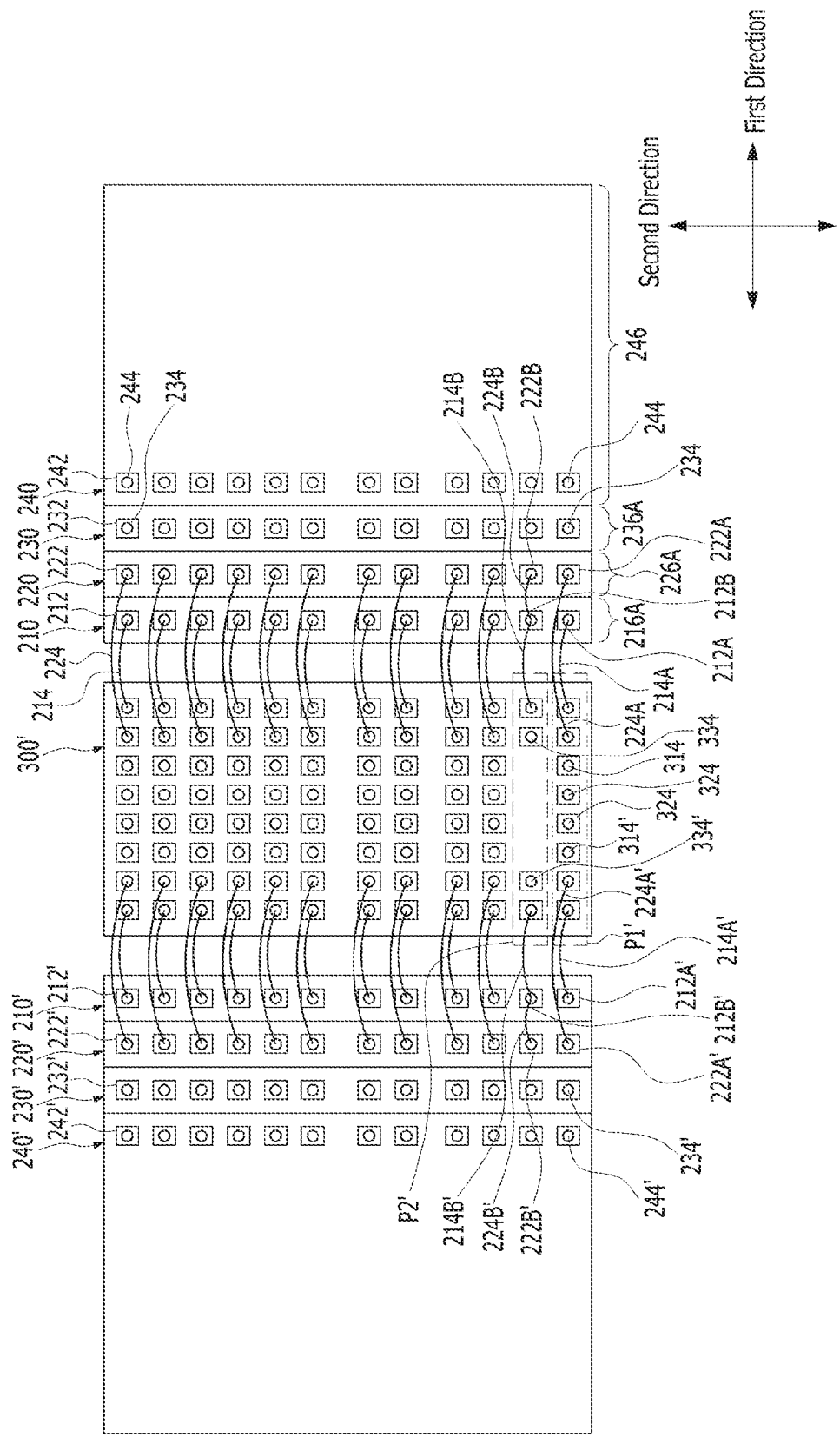

FIGS. 7A and 7B are cross-sectional and plan views illustrating a semiconductor package in accordance with an embodiment.

Referring to FIGS. 7A and 7B, a first chip stack 200, a bridge unit 300' and a second chip stack 200' may be disposed over the first surface 101 of the carrier substrate 100.

The first chip stack 200 is substantially the same as the chip stack 200 of the above-described embodiments, and thus represented by the same reference numeral. Thus, first to fourth wires 214, 224, 234 and 244 connected to the first chip stack 200 are substantially the same as the first to fourth wires 214, 224, 234 and 244 of the above-described embodiments, and thus are represented by the same reference numerals.

The second chip stack 200' may be located on the opposite side of the first chip stack 200 with the bridge unit 300' interposed therebetween. That is, when the first chip stack 200 is located on the right side of the bridge unit 300', the second chip stack 200' may be located on the left side of the bridge unit 300'.

The second chip stack 200' may have a symmetrical structure with the first chip stack 200 with the bridge unit 300' interposed therebetween. Thus, the second chip stack 200' may include first to fourth semiconductor chips 210', 220', 230' and 240' which are stacked with an offset to the opposite side of the first chip stack 200, for example, the left side. The first to fourth semiconductor chips 210', 220', 230' and 240' may include first to fourth chip pads 212', 222', 232' and 242' which are formed at the right edges of the first to fourth semiconductor chips 210', 220', 230' and 240' and exposed to the outside. A first signal pad 212A' and a first power pad 212B' of the first chip pads 212' may be formed at positions corresponding to the first signal pad 212A and the first power pad 212B of the first chip pads 212, respectively, and a second signal pad 222A' and a second power pad 222B' of the second chip pads 222' may be formed at positions corresponding to the second signal pad 222A and the second power pad 222B of the second chip pads 222, respectively. First to fourth wires 214', 224', 234' and 244' of the second chip stack 200' may also have a symmetrical structure with the first to fourth wires 214, 224, 234 and 244 of the first chip stack 200.

The bridge unit 300' may be expanded in the first direction more than the above-described bridge unit 300, such that redistribution pads for connection with the second chip stack 200', i.e. connection with the first and second wires 214' and 224' are further arranged. Since the first and second chip stacks 200 and 200' are symmetrical with each other, the first to fourth wires 214, 224, 234 and 244 of the second chip stack 200 and the right half of a redistribution layer 320' of the bridge unit 300 may have the same structure as the redistribution layer 320 of the above-described embodiment, and the left half thereof may have a symmetrical structure with the right half. In other words, the right half of redistribution pads P1' and P2' may have the same arrangement as the redistribution pads P1' and P2' of the above-described embodiments, and the left half thereof may be arranged symmetrically with the right half. Therefore, the first to fourth wires 214, 224, 234 and 244 and the first to third additional wires 314, 324 and 334, which are connected to the right half of the redistribution pads P1' and P2', may be formed in substantially the same manner as the first to fourth wires 214, 224, 234 and 244 and the first to third additional wires 314, 324 and 334 of the above-described embodiment, and the first to fourth wires 214', 224', 234' and 244' and first to third additional wires 314', 324' and 334', which are connected to the left half of the redistribution pads P1' and P2', may be formed symmetrically with the first to fourth wires 214, 224, 234 and 244 and the first to third additional wires 314, 324 and 334.

The package in accordance with the present embodiment is substantially the same as the package in accordance with the above-described embodiments, except that the second chip stack 200' and the wires 214' to 244' and 314' to 334' connected to the second chip stack 200' are symmetrical with the first chip stack 200 and the wires 214 to 244 and 314 to 334 connected to the first chip stack 200, and thus the redistribution layer 320' of the bridge unit 300' further includes the pads which are arranged symmetrically with the pads to which the wires 214 to 244 and 314 to 334 are connected for the connection of the wires 214' to 244' and 314' to 334'. Therefore, the detailed descriptions of the respective components of the package in accordance with the present embodiment are omitted herein.

In accordance with an embodiment, it may be possible to prevent a defect of a semiconductor package and to facilitate a method for fabricating the same.

Figure 8:
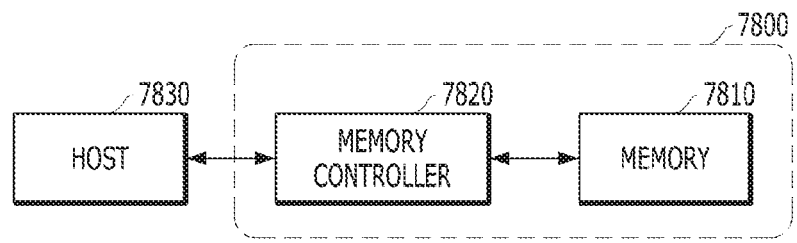
FIG. 8 shows a block diagram illustrating an electronic system employing a memory card including a semiconductor package, according to an embodiment.

FIG. 8 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 9:
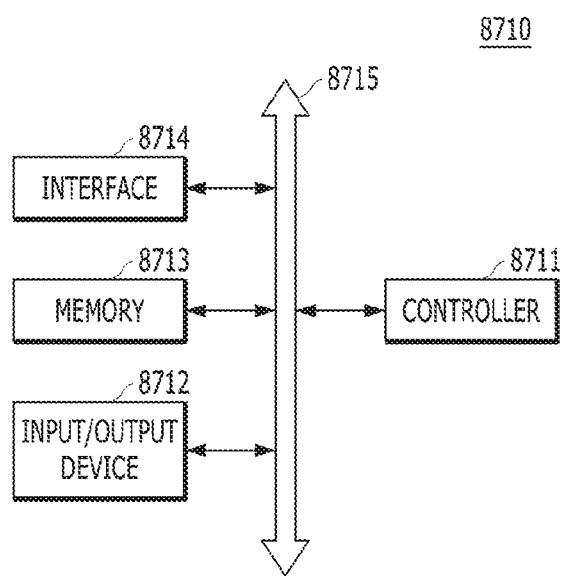
FIG. 9 shows a block diagram illustrating another electronic system including a semiconductor package, according to an embodiment.

FIG. 9 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the invention as defined in the following claims.

What is claimed is:

1. A semiconductor package comprising:
a chip stack comprising first to Nth semiconductor chips stacked with an offset to one side such that edges thereof on the other side are exposed, and having first to Nth chip pads disposed at the other-side edges, respectively, where N is a natural number more than 2, and the first to Nth chip pads include first to Nth signal chip pads to which signals are applied and first to Nth power chip pads to which a ground voltage or power voltage is applied;
a bridge unit disposed adjacent to the other side of the chip stack and spaced apart from the chip stack;
kth to Nth wires extended in a vertical direction while first ends of each of the kth to Nth wires are connected to the kth to Nth chip pads among the first to Nth chip pads, where k is a natural number more than 2 and equal to or less than N;
first ends of each of first to (k−1)th signal wires connected to the first to (k−1)th signal chip pads among the first to Nth signal chip pads and, second ends of each of the first to (k−1)th signal wires connected to the bridge unit;
first to (k−1)th power wires connecting the first to (k−1)th power chip pads while the first power wire connects the first power chip pad to the bridge unit;
additional first to (k−1)th signal wires electrically coupled to the first to (k−1)th signal wires, respectively, and extended in the vertical direction while first ends of the additional first to (k−1)th signal wires are connected to the bridge unit; and
an additional power wire electrically coupled to the first power wire, and extended in the vertical direction while a first end of the additional power wire is connected to the bridge unit.

2. The semiconductor package of claim 1, wherein a thickness of the bridge unit is larger than a total thickness of the first to (k−1)th semiconductor chips among the first to Nth semiconductor chips, and equal to or less than a thickness of the chip stack.

3. The semiconductor package of claim 1, wherein the bridge unit comprises:
a body part; and
a redistribution layer located on the body part, and connected to the wire of which the second end is connected to the bridge unit, among the first to (k−1)th wires, and the additional wire.

4. The semiconductor package of claim 3, wherein the body part is electrically insulated from the redistribution layer and the chip stack.

5. The semiconductor package of claim 3, wherein the redistribution layer comprises:

a first redistribution dielectric layer covering the body part;
a redistribution conductive layer on the first redistribution dielectric layer; and
a second redistribution dielectric layer covering the first redistribution dielectric layer and the redistribution conductive layer, and having openings to expose portions of the redistribution conductive layer.

6. The semiconductor package of claim 5, the redistribution conductive layer comprises first to (k−1)th signal conductive layers separated from one another,
the first to (k−1)th signal wires are connected to the first to (k−1)th signal conductive layers, respectively, and
the additional first to (k−1)th signal wires are connected to the first to (k−1)th signal conductive layers, respectively, while spaced apart from the first to (k−1)th signal wires.

7. The semiconductor package of claim 6, wherein a tth signal conductive layer among the first to (k−1)th signal conductive layers comprises a tth connection part having a relatively small width and tth end parts having a relatively large width and located on both sides of the tth connection part, where t is a natural number equal to or more than 1 and equal to or less than k−1,
a (t+1)th conductive layer comprises a (t+1)th connection part having a relatively small width and (t+1)th end parts having a relatively large width and located on both sides of the (t+1)th connection part, and
the tth conductive layer and the (t+1)th conductive layer are disposed so that the tth end parts and the (t+1)th end parts are alternately arranged.

8. The semiconductor package of claim 7, wherein a tth signal wire of the first to (k−1)th signal wires and a tth additional signal wire of the additional first to (k−1)th signal wires are connected to the tth end parts, respectively, and
a (t+1)th wire and a (t+1)th additional wire are connected to the (t+1)th end parts, respectively.

9. The semiconductor package of claim 8, wherein the tth signal wire is connected to a closer one of the tth end parts, and
the (t+1)th signal wire is connected to a closer one of the (t+1)th end parts.

10. The semiconductor package of claim 7, wherein the openings of the second redistribution dielectric layer overlap the tth end parts and the (t+1)th end parts, respectively.

11. The semiconductor package of claim 5, wherein the redistribution conductive layer comprises a power conductive layer, and,
the first power wire and the additional power wire are connected to the power redistribution conductive layer in common.

12. The semiconductor package of claim 11, wherein the power redistribution conductive layer is extended in one direction such that a first end of the first power wire and a first end of the additional power wire are arranged in the one direction to be spaced apart from each other.

13. The semiconductor package of claim 12, wherein the openings of the second redistribution dielectric layer overlap the first end of the first power wire and the first end of the additional power wire, respectively.

14. The semiconductor package of claim 1, wherein the first to Nth semiconductor chips comprise the same memory chips.

15. The semiconductor package of claim 1, further comprising a molding layer covering the chip stack and the bridge unit, and having one surface that exposes second ends of the kth to Nth wires, second ends of the additional first to (k−1)th signal wires, and a second end of the additional power wire.

16. The semiconductor package of claim 15, further comprising a package redistribution layer formed on the one surface of the molding layer, and electrically coupled to the second ends of the kth to Nth wires, the second ends of the additional first to (k−1)th signal wires, and the second end of the additional power wire.

17. The semiconductor package of claim 16, wherein the package redistribution layer comprises:
   a first package redistribution dielectric layer covering the one surface of the molding layer and having openings to expose the second ends of the kth to Nth wires, the second ends of the additional first to (k−1)th signal wires, and the second end of the additional power wire;
   a package redistribution conductive layer formed on the first package redistribution dielectric layer, and connected to the second ends of the kth to Nth wires, the second ends of the additional first to (k−1)th signal wires, and the second end of the additional power wire; and
   a second package redistribution dielectric layer covering the first package redistribution dielectric layer and the package redistribution conductive layer, and having openings to expose portions of the package redistribution conductive layer.

18. The semiconductor package of claim 16, further comprising external connection terminals which are electrically coupled to the package redistribution layer.

19. The semiconductor package of claim 1, further comprising an additional chip stack sharing the bridge unit with the chip stack.

20. The semiconductor package of claim 19, wherein the additional chip stack is disposed opposite to a side of the bridge unit adjacent to the other side of the chip stack so that the bridge unit is interposed between the chip stack and additional chip stack.

21. The semiconductor package of claim 19, wherein wires connected to the additional chip stack have a symmetrical structure with the kth to Nth wires, first to (k−1)th signal wires, first to (k−1)th power wires, additional first to (k−1)th signal wires, and the additional power wire which are connected to the chip stack.

* * * * *